(12) United States Patent
Celik et al.

(10) Patent No.: US 7,213,221 B1
(45) Date of Patent: May 1, 2007

(54) MODELING INTERCONNECTED PROPAGATION DELAY FOR AN INTEGRATED CIRCUIT DESIGN

(75) Inventors: Mustafa Celik, Santa Clara, CA (US); Ronald A. Rohrer, Saratoga, CA (US)

(73) Assignee: Magma Design Automation, Inc., Santa Clara, CA (US)

( * ) Notice: Subject to any disclaimer, the term of this patent is extended or adjusted under 35 U.S.C. 154(b) by 229 days.

(21) Appl. No.: 10/827,791

(22) Filed: Apr. 19, 2004

(51) Int. Cl.
*G06F 9/45* (2006.01)
*G06F 17/50* (2006.01)

(52) U.S. Cl. .................... 716/6; 716/1; 716/3; 716/18; 703/1; 703/2; 703/13

(58) Field of Classification Search .............. 716/1–6, 716/9–12, 18; 703/1–3, 12–20
See application file for complete search history.

(56) References Cited

U.S. PATENT DOCUMENTS

| | | | | |
|---|---|---|---|---|
| 5,381,345 A | * | 1/1995 | Takegami et al. | 703/19 |
| 5,559,715 A | * | 9/1996 | Misheloff | 703/19 |
| 6,041,170 A | * | 3/2000 | Feldmann et al. | 703/2 |
| 6,314,546 B1 | * | 11/2001 | Muddu | 716/5 |
| 6,701,497 B1 | * | 3/2004 | Ohkubo | 716/6 |
| 6,807,520 B1 | * | 10/2004 | Zhou et al. | 703/14 |
| 2004/0073418 A1 | * | 4/2004 | Nassif | 703/19 |

OTHER PUBLICATIONS

Barnard N. Sheehan, Library Compatible Ceff for Gate-Level Timing, 2002, IEEE.*

Chatzigeorgiou et al., Modeling CMOS Gates Driving RC Interconnect Loads, Apr. 2001, IEEE, vol. 48, No. 4, p. 413-418.*

Choi et al., A Simple CMOS Delay Model for Wide Applications, Nov. 1996, IEEE, p. 77-80.*

"SPIDER: Simultaneous Post-Layout IR-Drop and Metal Density Enhancement with Redundant Fill," ICCAD '05, Nov. 6-10, 2005, 6 pages, San Jose, CA.

Mustafa Celik, Lawrence Pileggi, and Alan Odabasioglu, "IC Interconnect Analysis," Chapter 8: Interfacing Interconnect and Gate-Delay Models, Jul. 2002, pp. 271-306, Kluwer Academic Publishers.

(Continued)

*Primary Examiner*—Jack Chiang
*Assistant Examiner*—Nghia M. Doan
(74) *Attorney, Agent, or Firm*—Fenwick & West LLP

(57) ABSTRACT

A system and a method are disclosed for performing a timing or signal propagation delay analysis on a circuit. The disclosure includes representing a drive logic stage as a representative linear circuit driven by a current source. The current source is represented as a function of a current at a constant value, a start time, a tail-start time, and a time constant of an equivalent capacitive circuit. Once the current source model is constructed, a logic stage can be analyzed for timing or signal propagation delay using conventional linear circuit analysis techniques. The disclosure also is applicable to resistance capacitance ("RC") interconnect circuits using a current source model in which an RC load is represented as an effective capacitance and the current source for use in a linear analysis is constructed using an iterative approach.

14 Claims, 7 Drawing Sheets

OTHER PUBLICATIONS

Florentin Dartu, Noel Menezes, and Lawrence T. Pileggi, "Performance Computation for Precharacterized CMOS Gates with RC Loads," IEEE Transactions on Computer-Aided Design of Integrated Circuits and Systems, vol. 15, No. 5, May 1996, pp. 544-553.

Richard Goering, "Synopsys Strengthens Liberty Library Format," EEdesign, [online], Retrieved on Feb. 3, 2004, Retrieved from: <http://www.eedesign.com/article/showarticle.jhtml?articleID=17406511>.

* cited by examiner

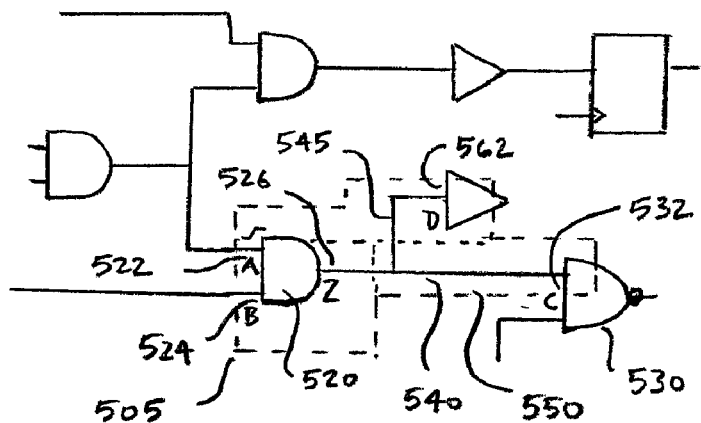
FIG. 5
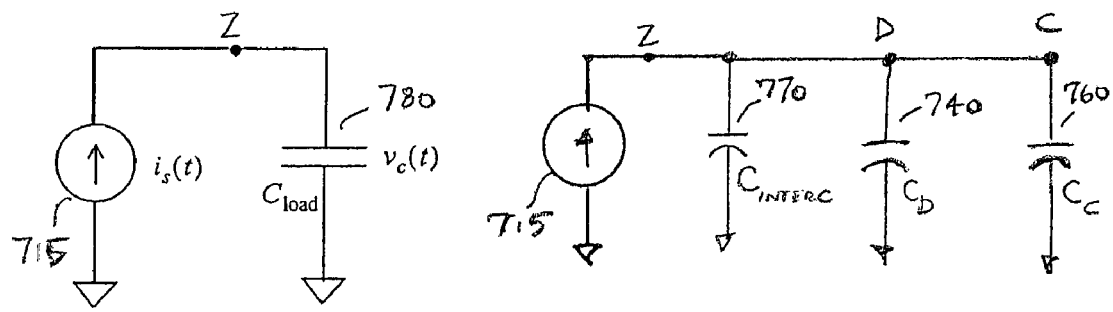
FIG. 7c
FIG. 7b

MODELING INTERCONNECTED PROPAGATION DELAY FOR AN INTEGRATED CIRCUIT DESIGN

BACKGROUND OF THE INVENTION

1. Field of the Invention

The present invention generally relates to the field of circuit modeling, and more specifically, to gate delay models.

2. Description of the Relevant Art

To shorten design cycles, digital systems are often designed at a gate and/or cell level. In contrast to designing at a transistor level, gate or cell level design can significantly reduce costly design verification by precharacterizing gate and cell delays for static timing analysis. The cell delays and transitions are generally expressed empirically as a function of load capacitance and input signal transition time. However, with the emerging interconnect dominance, gate loads can no longer be modeled by purely capacitive loads for high performance digital circuits.

For digital IC technologies in general, and CMOS in particular, it is assumed that a load at an output of the gate has a negligible impact on the waveform behavior at a gate input. Therefore, digital circuit delay calculation along timing paths can be performed gate by gate or logic state by logic state for applications such as timing analysis. It should be noted that the gate-source and gate-drain capacitances are included as part of the gate characterization and, therefore, not considered during the partitioning process.

Delay calculation is performed for each logic gate/state input individually. It is assumed that all other gate inputs are set to logic values such that an input pin under consideration can cause a gate output to transition. The outputs that are expected from a delay calculator are the waveforms at the fan-outs, as a function of the waveform at the switching input pin.

There are two approaches to gate delay modeling, which have gained widespread acceptance. The first is empirically derived expressions or look-up tables for delay and output-signal transition as a function of load capacitance and input-signal transition time (k-factor equations), which is further described below. The second is a switch-resistor model comprised of a linear resistor and a step function of voltage, also described below. Both methods are empirically based, since even the second method requires empirical fitting to approximate the resistance value.

Switch resistor models have an advantage that their coupling with an RC interconnect is inherently modeled. That is, the resistance model is able to capture the interaction of the gate's output resistance and the RC load. Timing analysis tools such as TV and Crystal were developed using switch-resistor models to analyze the transistor level circuit descriptions. The main difficulty with these approaches is calculating a single linear resistor, which captures the switching behavior of a CMOS gate. Recognizing that this resistance is a function of the gate's input signal transition. Recognizing that this resistance is a function of the gate's input signal transition time and output load, in a single output resistance for the gate is empirically derived. That is, the resistance is calculated as the average output impedance over a range of input signal transition times and output loads.

When the load is purely capacitive, one can completely precharacterize a gate's delay and output signal behavior as a function of input signal transition time, $t_{tr-in}$, and load capacitance, $C_L$. The experimental data for delay, $t_d$, and gate-output waveform transition time, $t_{tr-out}$, are generally fitted to k-factor equations:

$$t_d = k(t_{tr-in}, C_L)$$

$$t_{tr-out} = k'(t_{tr-in}, C_L)$$

where k and k' are empirically fitted functions, and the delay and transition times are defined as shown in FIG. 1. Note that the waveforms are simplified as saturated ramps by fitting a line through two predefined characterization points. With this approximation it is possible to represent the waveshape with a single number, the transition time.

Some methodologies use more than two points to characterize the waveshape, while others employ more complex load models—both of which increase the complexity of delay calculation significantly. These types of characterizations are mainly used for back-end verification processes for which speed is not critically important.

The delay and output transition time can also be characterized via look-up tables. The construction of such a table is illustrated in FIG. 2. Generally, gate delays may be characterized with look-up tables, they may be equally applicable to k-factor delay models (regression fit of table data) as well.

Due to the increase in total metal resistance with scaling, and the tendency for the effective gate output resistances to decrease as technologies are advanced, the RC shielding effect becomes significant for deep submicron CMOS. To illustrate this point, consider a simple gate model driving a distributed RC interconnect, with a load capacitance at the end of the line, as shown in FIG. 3. Assume that a resistance and a Thevenin voltage source that are functions of input transition time and output capacitance load model the gate. In this case, assume that the gate output resistance, $R_d$, and Thevenin voltage signal were selected as those values that would yield the same output delay and transition time as the actual gate when the load is the total capacitance, $C_M + C_L$.

If $R_d \gg R_M$, then the gate delay is accurately characterized by the empirical model as a function of total capacitance. However, if one considers the same gate resistance and total load capacitance, but increases the metal resistance so that $R_d \ll R_M$, the gate delay at node $v_{out}$ will decrease. This decrease in delay is due to the metal resistance shielding a portion of the downstream load capacitance. The difference in responses is sketched in FIG. 3. Note that the gate delay decreases, but the overall delay at $C_L$ would increase due to an increase in $R_M$. In addition, the responses for lines with significant metal resistance also tend to have non-digital shaped waveforms as shown.

In order to preserve the simplicity and efficiency of the empirical gate models for complex RC loads, one can map the complex load to an effective capacitance (Ceff). Since its invention, the $C_{eff}$ approach has been successfully used in the design of high-speed ICs.

The simplest model of a gate and corresponding interconnect delay would be a two-step approximation, in which a complete stage delay is the sum of the gate and interconnect delays. To capture the gate delay using a simple empirical gate delay model, the RC load is replaced by the effective capacitance, $C_{eff}$, and then the gate delay and output transition time is obtained from the empirical model of the gate. Once the transition time at the gate output is calculated, the gate output wave-form is approximated with a saturated ramp. The interconnect delay is then calculated using this saturated ramp waveform as the input excitation.

This two-step delay approximation works well when the load seen by the gate is accurately approximated by the total capacitance of the net. That is, if the metal resistance is negligible, the whole interconnect behaves like an equipotential surface and the waveform at the gate output appears instantly at all fan-outs—i.e., there is no slope degradation or delay from gate output to fan-outs.

However, with increasing effects of interconnect resistance, gate output waveforms become increasingly nondigital and can no longer be modeled as saturated ramps. A conventional response to this problem is to use Thevenin gate models based on the $C_{eff}$ concept. As shown in FIG. 4, a time-varying voltage source and a constant resistor replaces the gate. Based on a gate input wave-form, A, the gate is modeled as a linear Thevenin equivalent with a time-varying voltage waveform, T. The voltage waveshape T is iteratively determined as a function of the effective capacitance. Once the Thevenin model is parameterized, the interconnect is then attached to the linear gate model and a linear circuit evaluation is performed. With this modeling approach, the RC nature of the interconnect can be captured to obtain the gate output and fan-out waveforms more accurately.

The Thevenin voltage waveform T is generally modeled via a saturated ramp voltage that is characterized by a transition time $\Delta t$ and a delay $t_0$. The values of the Thevenin model parameters, $t_0$, $\Delta t$, and $R_d$, are chosen such that the waveshape at the model output and the actual waveform from the library lookup match. However, since the look-up tables and k-factor equations are not defined for noncapacitive loads we need to use an intermediate effective capacitance value, $C_{eff}$. To find $C_{eff}$, a commonly used procedure is to compute a capacitance value such that when the driver is the Thevenin model, the average current into the interconnect and $C_{eff}$ are equal. Once $C_{eff}$ is computed, it is used in the library lookup to obtain the gate output (delay and transition time). Then a Thevenin voltage is computed to match the library response.

A problem with conventional approaches, including the Thevenin equivalent model, is that they fail to represent the real physics or transistors, and hence, the calculations provide less than desired accuracy in gate modeling. In addition, in models such as Thevenin equivalents, only resistance is accounted for while in actuality, there is also capacitance present at the gate that does not get accounted. Again, this leads to less than desired accuracy in gate modeling. Yet another problem is that the actual circuit resistance is nonlinear although conventional modeling show resistance as linear, which also leads to further inaccuracies in gate modeling.

Therefore, there is a need for a system and process to provide more accurate gate modeling for use in circuit models and designs.

SUMMARY OF THE INVENTION

The present invention includes a system and a method to model a logic stage in a circuit for determining a delay between an input of driving logic element gate and an input of a driven gate. The present invention may be used for purely capacitive loads and may be configured for use with RC interconnect loads.

In one embodiment, the process of the present invention includes identifying a drive logic element having an input and an output in a first logic stage. The process then identifies, for each stage driven by the drive logic element in the first logic stage, a next stage logic element having an input configured to couple the output of the drive logic element. In addition, the process identifies interconnects with the output of the drive logic element and the input of each stage driven by the drive logic element. The process proceeds to represent the drive logic element as a current source model. In particular, the process determines a load capacitance value corresponding the capacitance of the identified interconnects and a capacitance representative of each stage driven by the drive logic element.

The process then determines a constant value for current in the current source model by identifying a change in voltage as a function of time. In addition, it determines a start time for the current in the current source model having the constant value, a time constant for exponential decay of the current in the current source model, and a transition time when the current begins the exponential decay of the current in the current source model.

Once these parameters are identified, the process replaces the drive logic element in a linear circuit representation of the first logic stage with a current source characterized as a function of the current at the constant value, the start time, the transition time, and the time constant. The process can then perform a conventional linear analysis on the linear circuit representation for appropriate timing or signal propagation delay analysis.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE SEVERAL VIEWS OF THE DRAWINGS

The invention has other advantages and features which will be more readily apparent from the following detailed description of the invention and the appended claims, when taken in conjunction with the accompanying drawings, in which:

FIG. ("FIG.") 1 illustrates a prior art delay and transition timing between an input and an output of a logic gate.

FIG. 5 illustrates a drive logic stage for driving next logic stages in accordance with one embodiment of the present invention.

FIGS. 7a through 7c illustrate an equivalent linear circuit for preparing a timing analysis (or calculating signal propagation delay) for a logic stage in accordance with the present invention.

DETAILED DESCRIPTION OF THE INVENTION

Figure 1:
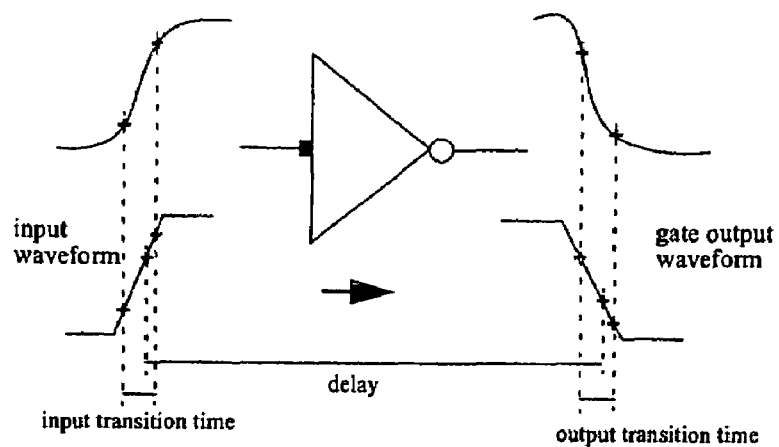
Figure 2:
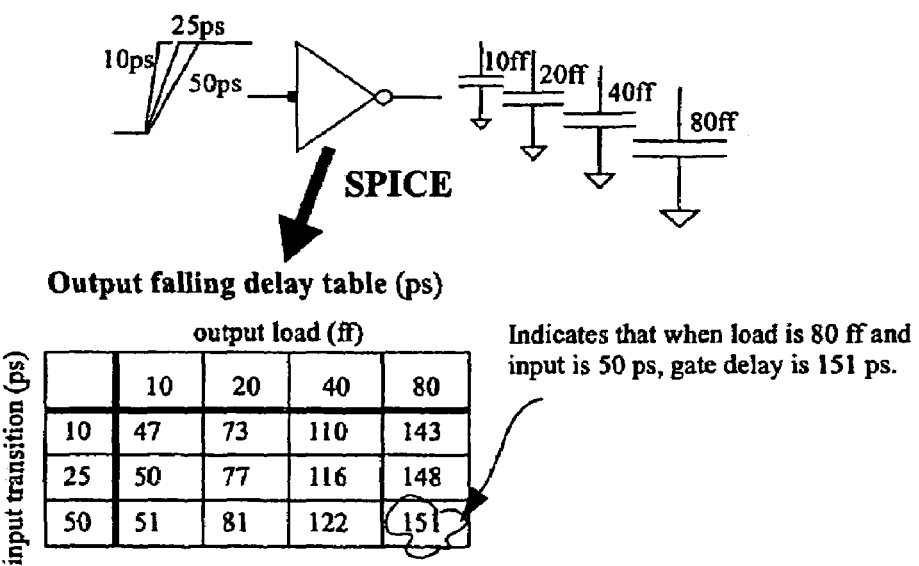
FIG. 2 illustrates a prior art look-up table for delay and output transition time.
Figure 3:
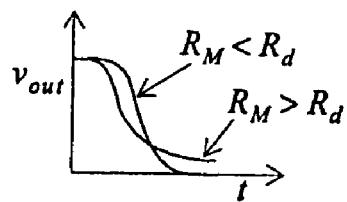
FIG. 3 illustrates a prior art simple gate model driving a distributed RC interconnect.
Figure 3:
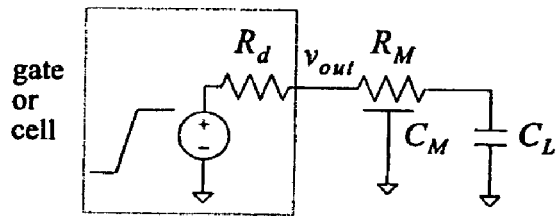
Figure 4:
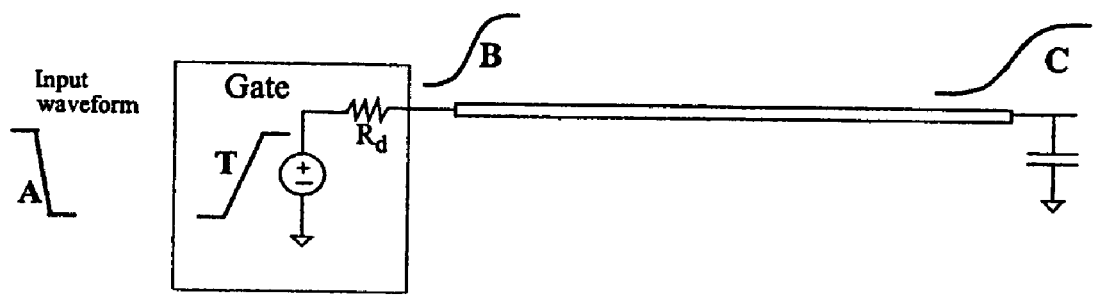
FIG. 4 illustrates a prior art Thevenin gate model replacing a gate to determine delay.

The Figures ("FIG.") and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Current Source for Pure Capacitance Load

Referring now to FIG. 5, a logic stage 505 includes a driver gate 520 and driven logic inputs C 532 and D 562 and interconnects 540, 545 (note that interconnects may comprise one wire or multiple wires) between them in accordance with the present invention. The drive logic stage 505 drives subsequent logic elements in subsequent logic stages. The present invention includes a system and method for determining timing (or signal propagation delay) between an input of the drive logic stage 505 and an input of each logic element in subsequent logic stages driven by a logic element in the drive logic stage 505.

Each logic stage includes a logic element, one or more driven logic elements and an interconnect between them. The interconnect is typically a metal or metallic wire having a resistance and capacitance. In FIG. 5, a first logic stage 505 (which is the drive logic stage in this example) includes a first logic gate 520, having two inputs A 522 and B 524, and an output Z 526 that couples through wire 540 with an input C 532 of a second logic gate 530 that is part of a next (or subsequent) logic stage. A second logic stage 550 includes the first logic gate 520 of which the output Z 526 that connects through wire 545 with an input D 562 of an inverter 560 that is part of another subsequent logic stage. It is noted that the interconnects 540, 545 between Z, C, and D may be one interconnect element.

When performing timing analysis or determining signal propagation delays in a logic stage, a conventional liberty (or .LIB, LIB, or dotlib) library (in electronic design automation tools) includes look-up tables that provide both delay and transition time values to help calculate or determine timing or signal propagation delays through the logic stage. However, the tables in conventional dotlib are limited because resistance values do not get accounted for as feature sizes for circuit designs continue to get smaller. The present invention provides a system and a method for more accurately representing gate models in circuit designs, for example, by taking into account the physics of transistor operation, including capacitance and resistance effects.

Hence, the present invention provides a system and a process for identifying a delay between an input of a logic element of a drive logic stage 505, e.g., input A 522 or input B 524, and an input of a logic element, e.g., input C 532 or input D 562, of a subsequent logic stage that is being driven using a given gate. In one embodiment, this may be approached by identifying a given logic element, load capacitance, and waveform that is driving the logic element, an output current, and a voltage waveform. It is noted that waveforms at Z, D and C inputs are computed in a delay calculator for when input A 522 pin is switching from low to high. A separate computation is required when input A 522 switches from high to low or when input B 524 switches.

Figure 6:
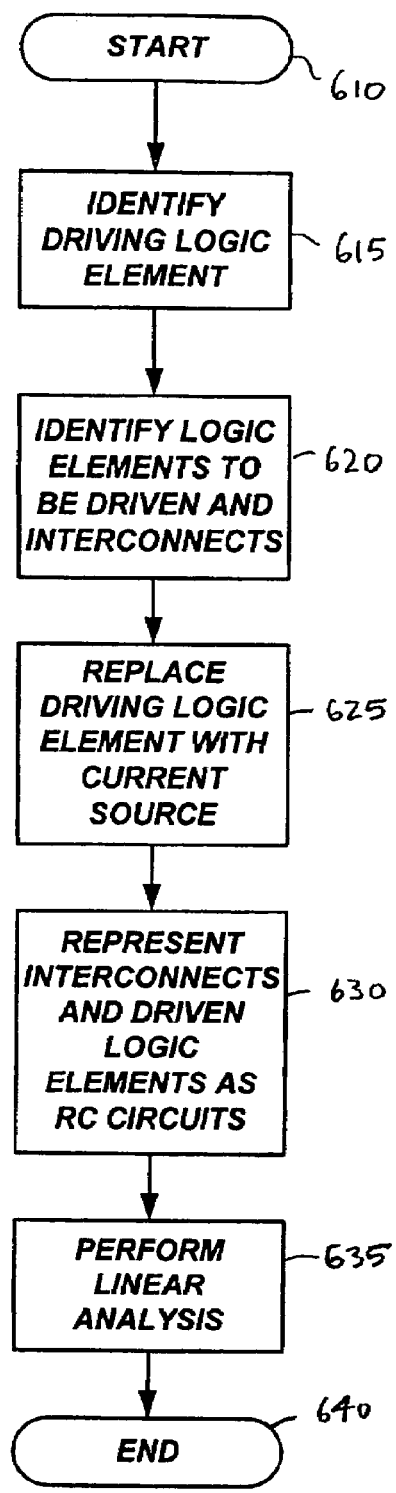
FIG. 6 illustrates a flow diagram of a process for a timing analysis on a logic stage in a circuit in accordance with the present invention.

Referring now to FIG. 6, it illustrates a flow diagram of a general process for a timing analysis (or determining signal propagation delay) in a drive logic stage of a circuit in accordance with the present invention. The process starts 610 and identifies 615 a drive logic element, e.g., a driving gate, in a drive logic stage of the circuit. The process identifies 620 logic elements, e.g., driven gates, in subsequent logic stages that will be driven by the drive logic element. The process also identifies 620 interconnects, e.g., metal wires, between an output of the driving logic element and an input of the logic element to be driven.

The process provides a model replacement (representation) 625 of the drive logic element, with a current source representation. The representation may be through use of a dotlib library. The process also provides a model representation 630 of the interconnects and driven logic elements as resistance-capacitance ("RC") elements. With a model representation of drive logic stage as a current source with RC elements, the process can perform a conventional linear analysis 630 on the circuit to determine delay parameters using conventional tools for RC analysis before the process ends 635. Examples of RC analysis include asymptotic waveform evaluation ("AWE").

Figure 7A:
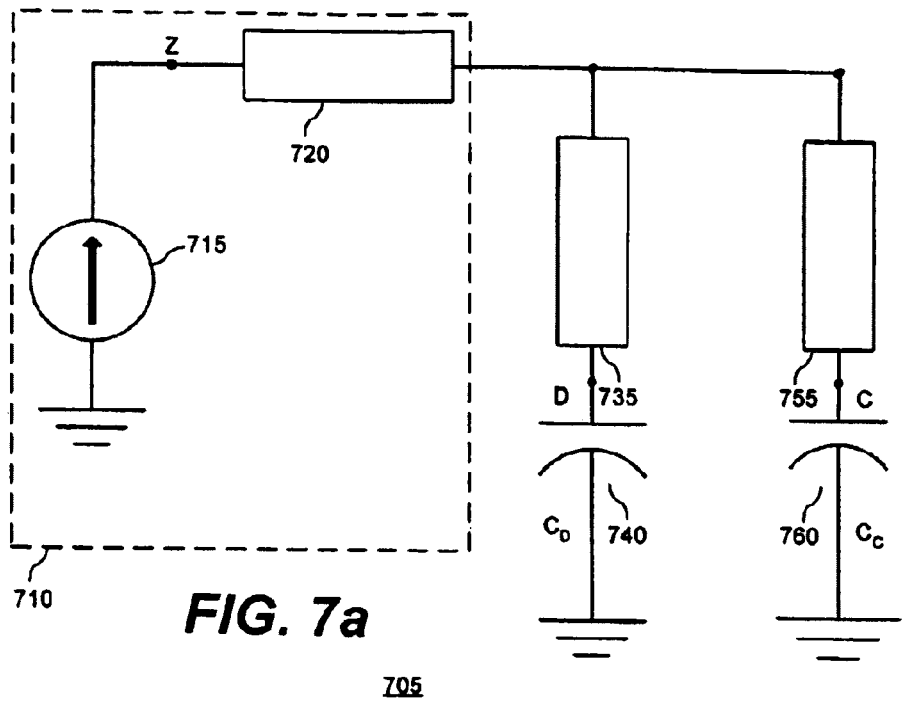

FIG. 7a illustrates an equivalent linear circuit 705 of the drive logic stage 505 and inputs of subsequent driven logic stages for preparing a timing analysis in accordance with the present invention. The equivalent linear circuit 705 includes a drive logic element represented as a current source 715 and a drive logic element interconnect 720 that connects at an output Z of the drive logic element. The equivalent circuit 705 also illustrates an equivalent representation of inputs into the two subsequent logic stages 740, 760 driven by the drive logic element (current source) 715. In particular, the input into the subsequent logic stages are driven logic elements represented as capacitance ($C_D$, $C_C$) 740, 760.

To conduct a timing analysis on the equivalent linear circuit, the system and process determines a value of the current source 715. In one embodiment, the equivalent linear circuit 705 in FIG. 7a is simplified to a capacitive equivalent circuit 707 as shown in FIG. 7b. In particular, the interconnects 720, 735, and 755 are represented as purely capacitive so that they may be combined as a single capacitive representation, $C_{IC}$, 770 ($C_{IC}=C_{720}+C_{735}+C_{755}$). Thereafter the capacitive equivalent circuit 707a is further simplified to the capacitive equivalent circuit 707b in FIG. 7c. In particular, from the output Z of the drive logic stage, the logic stages being driven are seen as a capacitive load, $C_{load}$, 780 ($C_{load}=C_{IC}+C_D+C_C$). With a representation of the equivalent linear circuit 705 of the drive logic stage 505 as an equivalent capacitive circuit 707b, the system and method of the present invention turns to constructing an appropriate current source 715 for use back in the equivalent linear circuit 705.

Figure 8:
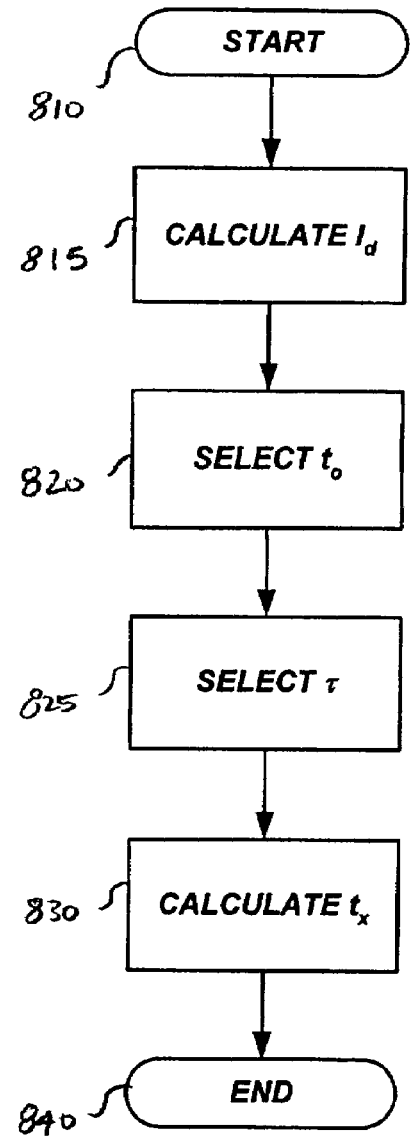
FIG. 8 illustrates a flow diagram for determining a current source equivalent for a driving logic gate of a logic stage for driving a pure capacitive load in accordance with the present invention.
Figure 9A:
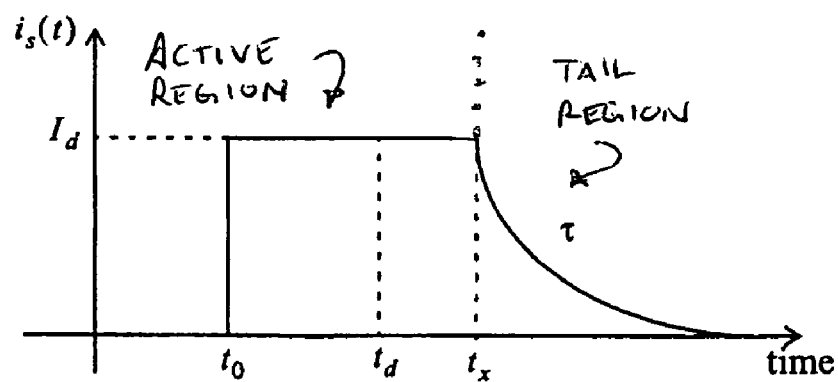
FIGS. 9a and 9b illustrate a current and voltage characteristic timing diagram for use to determine parameters for current source equivalent for a driving logic gate of a logic stage in accordance with the present invention.
Figure 9B:
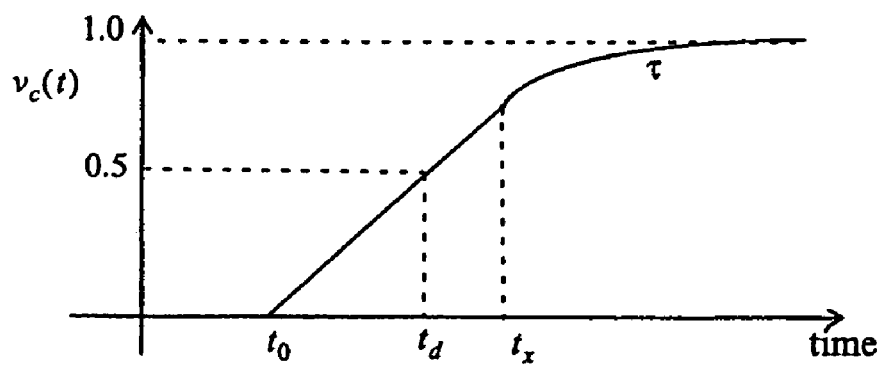

FIG. 8 illustrates a flow diagram for determining a current source equivalent for a driving logic gate of a logic stage in accordance with the present invention. The process will be described with reference to FIGS. 9a and 9b. FIGS. 9a and 9b illustrate a current and voltage characteristic timing diagram for use to determine parameters for a current source equivalent for a driving logic gate of a logic stage in accordance with the present invention.

Given a $C_{load}$ and an input transition time, $tr_{in}$, the process constructs an appropriate current source model. It is noted that the current source 710 comprises a time-varying current source that is represented piecewise as:

$$i_s(t) = \begin{cases} 0, & t < t_0 \\ I_d, & t_0 \leq t \leq t_x \\ I_d e^{\frac{-(t-t_x)}{\tau}}, & t > t_x \end{cases}$$

Hence, to generate an appropriate current source model for the current source 710, parameters that need to be determined (or calculated) include constant current ($I_d$), start time ($t_0$), tail start time ($t_x$), and exponential decay ($\tau$). Each parameter is also shown in FIGS. 9a and 9b and further described in the context of FIG. 8.

Referring now to FIG. 8, the process starts 810 with the current source model including two regions as shown in FIGS. 9a and 9b. The first region is between times $t_0$ and $t_x$, in which the current from the current source remains constant at $I_d$. The second region is referred to as the tail region and is the area beyond time $t_x$, in which the current exponentially decays at a rate $\tau$. Integrating the piecewise representation of the current source, the voltage waveform at $C_{load}$ is:

$$v_c(t) = \begin{cases} 0, & t < t_0 \\ \frac{I_d}{C_{load}}(t - t_0), & t_0 \leq t \leq t_x \\ 1 - (1 - V_x)e^{\frac{-(t-t_x)}{\tau}}, & t > t_x \end{cases}$$

where it is assumed that $V_c(t)$ is normalized by the supply voltage. In addition, Vx is $$V_x = \frac{I_d}{C_{load}}(t_x - t_0).$$

Next, the process is configured to identify values of four parameters, $I_d$, $t_0$, $t_x$, $\tau$, of the model. The process first calculates the constant current, $I_d$. Specifically, referring to the voltage curve in FIG. 9b, the process considers a slope at the delay threshold crossing of the output voltage, $V_d$, (e.g., 0.5):

$$\text{slope} = \frac{d}{dt} v_c(t) \bigg|_{v_c(t)=V_d} = \frac{I_d}{C_{load}}.$$

So that $I_d$ comprises:

$$I_d = \text{slope} \cdot C_{load}$$

where slope is picked up from the dotlib library. The slope value is obtained by first getting the transition time of the output (or output transition time) (or $tr_{out}$) information from the dotlib library:

$tr_{out}$=get_transitiontime(library,$tr_{in}$,$C_{load}$).

Output transition time ($tr_{out}$) is defined as $tr_{out}=t_h-t_l$, where $t_h$ and $t_l$ are the time points such that $v(t_h)=V_h$ and $v(t_l)=V_l$ with $V_h$ and $V_l$ are being the high and low voltages defining the start and end points of the transition. Hence, slope is defined in this case as:

$$\text{slope} = \frac{(V_h - V_l)}{(t_h - t_l)}$$

Thus, $$I_d = \frac{(V_h - V_l)C_{load}}{tr_{out}}.$$

Once $I_d$ is known, the process selects 820 $t_0$ such that the delay of the output voltage matches the delay from the dotlib library. For example, $t_d$ may be the delay for $V_d$ crossing obtained from the dotlib library:

$t_d$=get_delay(library, $tr_{in}$, $C_{load}$).

Using this information in the model, the process solves:

$$v_c(t_d) = \frac{I_d}{C_{load}}(t_d - t_0) = V_d$$

to obtain $$t_0 = t_d - \frac{V_d C_{load}}{I_d}.$$

To model the exponential region, the process selects 825 (or obtains) the time constant information from the dotlib library:

$\tau$=get_tau(library,$tr_{in}$,$C_{load}$).

In alternative embodiments, the process approximates a value for the exponential decay number from a driver resistance, $R_D$. There are different models available to calculate the driver resistance. For example, a conventional Thevenin model approximates this number from the asymptote of the output slew versus $C_{load}$ curve for the fastest input transition. Using an approximation provides:

$\tau = R_D \cdot C_{load}$

The next parameter the process calculates 850, $t_x$, is an area constraint. That is, the area under the $i_s(t)$ curve in FIG. 9a should be equal to the load capacitance, $$\int_0^\infty i_s(t)\,dt = (t_x - t_0)I_d + \tau I_d = C_{load}.$$

This allows $t_x$ to be expressed as $$t_x = \frac{C_{load}}{I_d} + t_0 - \tau$$

The process then ends 830 with the constructs for the current source 715 so that it is now represented as:

$$[I_D, t_0, t_x, \tau] = \text{construct\_model}(\text{library}, tr_{in}, C_{load})$$

The current source 715 is reinserted into the equivalent linear circuit 705 for general interconnect circuits. It is noted that for the pure capacitive loading case, there is no need for further analysis.

Current Source for General Interconnect Circuit

The system and process disclosed herein advantageously provides a circuit configuration for modeling timing or signal propagation delay in a logic stage using a current source model with purely capacitive load analysis. The principles of the present invention may also be applied more generally to RC interconnect type circuits. In particular, conventional circuits are typically not purely capacitive and rather have some associated resistance. Thus, waveforms at Z, D, and C in the equivalent linear circuit 705 illustrated FIG. 7a are somewhat different which affects timing or signal propagation delay analysis.

Figure 10:
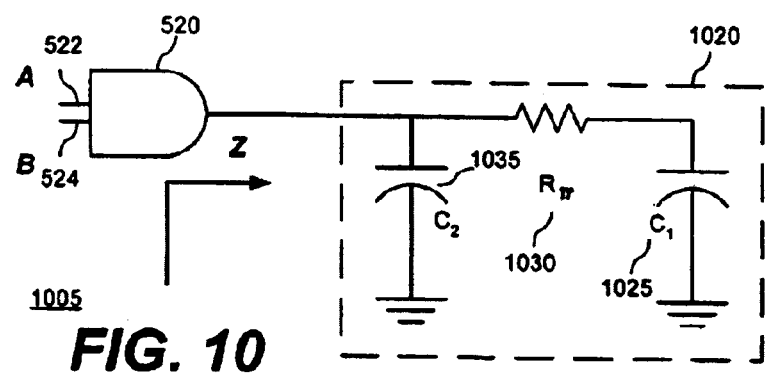
FIG. 10 illustrates a representative circuit of a drive logic stage from the perspective of an output Z of the drive logic stage in accordance with the present invention.

Referring to the drive logic stage 505 illustrated in FIG. 5, the circuit is modeled as a representation from output Z looking out at inputs of the next stages, C and D. FIG. 10 illustrates a representative circuit 1005 of the drive logic stage 505 from the perspective of output Z in accordance with the present invention. The representative circuit 1005 includes the first logic element, the logic gate 520, in the drive logic stage 505 and a π circuit 1020 as viewed from the output Z. The π circuit 1020 includes a first capacitance $C_1$ 1025 and a second capacitance $C_2$ 1035 and a π resistance 1030, which represent the interconnect and logic elements of the next logic stages from the perspective of the output Z of the drive logic stage. It is noted that in alternative embodiments, any type of input circuit representation, Y(s), e.g., admittance circuit, may be used.

When π resistance 1030 in the π circuit 1020 is zero, the output Z of the drive logic stage sees a purely capacitive load, a current source, e.g., 715, as described previously may be used to analyze an equivalent linear circuit for timing or signal propagation delays. However, where the π resistance 1030 is not zero, delay values for a load are not available in conventional dotlib libraries. Hence, to perform timing or signal propagation delay analysis, the present invention includes a system and a method for modeling a current source using an effective capacitance value, $C_{eff}$, representative of the π resistance 1030 and capacitances $C_1$ 1025 and $C_2$ 1035.

Figure 11:
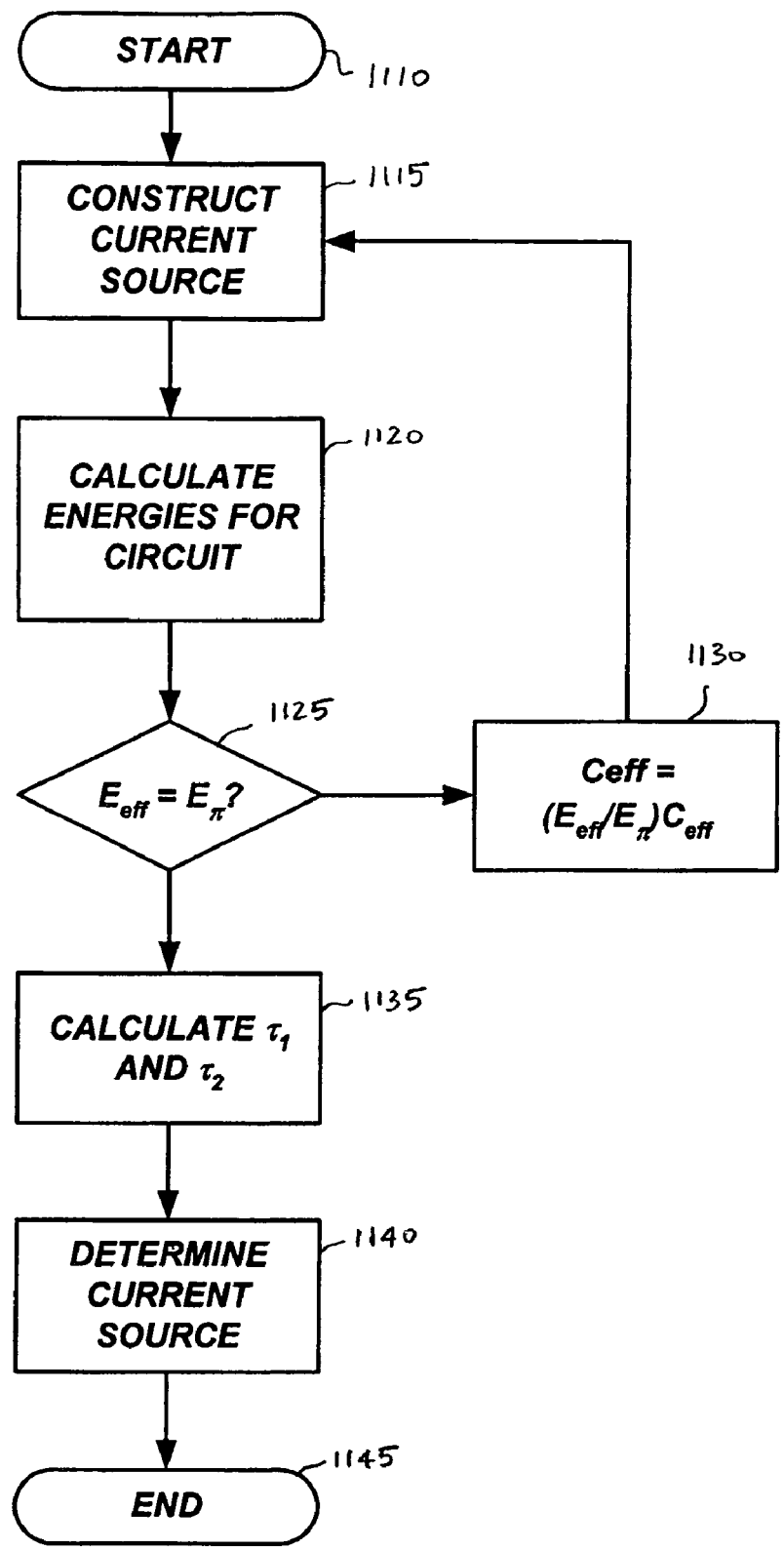
FIG. 11 illustrates a flow diagram for obtaining a current source for use in analyzing a general RC interconnect circuit in accordance with the present invention.

FIG. 11 illustrates a flow diagram for determining a current source for use in analyzing a general RC interconnect circuit in accordance with the present invention. The process starts 1110 using an assumption that a load is not a capacitance, but a general RC circuit. The π circuit 1020 is an admittance of the load seen by the logic element, e.g., the gate 520. When the admittance of the π circuit 1020 equals 0, the circuit is reduced to a pure capacitive load. In this general case an "effective capacitance" concept is used to construct 1115 a current source to model the logic element, e.g., gate 520. The effective capacitance, $C_{eff}$ is described as given a gate and a load with admittance having value π, there exists a $C_{eff}$ value such that the active region of $i(C_{eff})$ is a good approximation for the active region of $i(\pi)$. It is noted $i(C_{eff})$ is the gate output current when the load is $C_{eff}$. Further $i(\pi)$ is the gate output current when the load is the π circuit.

To find $C_{eff}$, the process first turns to calculating 1120 energies for the π circuit 1020. In particular, a value for $C_{eff}$ is then selected such that the energies delivered by the $i(C_{eff})$ current source to the $C_{eff}$ and π circuit 1020 loads are equal $$\int_0^{t_f} i(C_{eff}) v_{out}(C_{eff}) dt = \int_0^{t_f} i(C_{eff}) v_{out}(\pi) dt$$

where $t_f$ may be chosen as $t_x$ or ∞ (infinity).

To calculate $C_{eff}$, an upper and a lower bound for a π circuit 1120 load is calculated using $C_{eff}$ equal to $C_1 + C_2$ (=$C_{total}$). Because of the resistance between $C_1$ and $C_2$, the waveform on $C_1$ will be faster than the waveform on $C_{eff}$ implying that the energy delivered to the π circuit 1020 will be larger. To match the energies, the waveform on $C_{eff}$, is sped up, which can be achieved by reducing the value of $C_{eff}$. This means that $C_{eff}$ has to be smaller than $C_{total}$.

Assuming that $C_{eff}$ is equal to $C_2$, the waveform on $C_{eff}$ will be faster than the one on $C_2$, which implies a larger energy in the $C_{load}$ case. To match the energies, the waveform on $C_{eff}$ is slowed down, which can be done by increasing the $C_{eff}$ value. Therefore, $C_{eff}$ should be larger than $C_2$. Overall, the process calculates energies to determine 1125 when the energy of $C_{eff}$ is equal to the energy of the π circuit 1020. When the energies are found to be equal, the appropriate value of $C_{eff}$ is noted.

To compare energies until they are found to be equal, the process calculates the effective capacitance, $C_{eff}$, in an iterative manner. Specifically, $C_{eff}$ is first set to either $C_{total}$ or $C_2$ (from interconnect models). For each iteration, the current source model updated with the new value of effective capacitance, $C_{eff}$, and energies of the effective capacitance to the energy of the π circuit 1020 are calculated 1120 and compared 1125. If the energy values are not equal, the $C_{eff}$ value is updated 1130 as $$C_{eff} = \frac{E_{Ceff}}{E_\pi} C_{eff}.$$

After the update of the effective capacitance value, $C_{eff}$, another current source is constructed 1115 using this new value of $C_{eff}$. Thereafter, the process again calculates 1120 the energies of the effective capacitance and p circuit 1020 1120 to determine 1125 if $E_{eff} = E_\pi$. Usually the $C_{eff}$ value converges after two or three iterations so that the energies are equal. Once $E_{eff} = E_\pi$, the process calculates the active region using the model for a current source (active region (or part)) for $i(C_{eff})$ may be constructed using:

$$[I_D, t_0, t_x, \tau] = \text{construct\_model}(\text{library}, tr_{in}, C_{eff}).$$

Thereafter, the process calculates 1140 $\tau_1$ and $\tau_2$ corresponding the tail region.

To calculate $\tau_1$ and $\tau_2$, the process calculates a value corresponding to a and b such that $$a = R_d R_\pi C_1 C_2$$

$$b = (C_1 + C_2) R_d + R_\pi C_1$$

and thereafter $$\tau_1 = -2a/(-b + \sqrt{(b^2 - 4a)})$$

$$\tau_2 = -2a/(-b - \sqrt{(b^2 - 4a)}).$$

In the tail region, $$i(t) = k_1 e^{-(t-tx)/\tau_1} + k_2 e^{-(t-tx)/\tau_2}$$

where $k_1$ and $k_2$ are corresponding residues. From a continuity of i(t) at $t_x$, $$I_d = k_1 + k_2$$

and from the area constraint, $$(t_x - t_o)I_d + \tau_1 k_1 + \tau_2 k_2 = C_{total}.$$

Thereafter, using the above, the process is configured to calculate for $k_1$ and $k_2$ to get current $I_d$.

With the tail value calculated the process determines 1140 an appropriate current source before ending 1145. Once the current source constructed, the π circuit 1120 replaced with the original interconnect circuit. From here, the process identifies delays at the fanouts (i.e., inputs of driven logic gates at subsequent stages) by using conventional RC circuit (or other linear circuit) calculations and analysis, e.g., AWE.

The present invention provides a number of benefits and advantages. For example, it provides more accurate modeling for circuit design. It also provides a more simplified circuit analysis over conventional Thevenin model-based circuit analysis. The present invention also provides for faster, less resource intensive modeling without sacrificing, and rather improving, modeling accuracy.

It is noted that one embodiment present invention may be configured to function in a conventional data processing system environment. For example, the data processing environment includes products, tools, and mechanisms used for and/or in conjunction with electronic data automation systems.

Further, the processes and calculations disclosed herein may be configured as a computer program product (e.g., software) that may be stored on a computer readable medium (e.g., a volatile or non-volatile memory or storage device or medium. In addition, the computer program product may be stored within one medium or distributed among two or more mediums. Further, the computer program product comprises instructions readable and executable by a processor (or processing unit or processing system). The instructions may be readable and executable by one processor or distributed across two or more processors.

Alternative embodiments of the present invention may be structured to operate as individual or clustered functional components that are configured in hardware, software, firmware, or a combination thereof. For example, particular functions or processes described above may be configured in hardware and firmware, while other functions or processes described may be configured in software that couples with the hardware and firmware.

Upon reading this disclosure, those of skill in the art will appreciate still additional alternative structural and functional designs for a system and a process for providing a circuit model for evaluating timing or signal propagation delay in a circuit, e.g., a logic stage, through the disclosed principles of the present invention. Thus, while particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. A method to model a logic stage in a circuit for determining a delay between an input of a driving logic element gate and an input of a driven gate, the method comprising:
    identifying, in a first logic stage, a drive logic element having an output;
    identifying, for each stage driven by the drive logic element in the first logic stage, a next stage logic element having an input configured to couple the output of the drive logic element;
    identifying interconnects between the output of the drive logic element and the input of each stage driven by the drive logic element;
    representing the drive logic element as a current source model;
    calculating a value for a current source in the current source model, the value comprising a constant value and an exponential decay value;
    representing the first stage of the first logic stage with the current source model; and
    representing each next stage logic element as an equivalent resistor-capacitor circuit, the current source model and each equivalent resistor-capacitor circuit providing a linear circuit representation.

2. The method of claim 1, wherein the step of calculating further comprises:
    determining a load capacitance value corresponding to the capacitance of the identified interconnects and a capacitance representative of each stage driven by the drive logic element;
    determining the constant value for current in the current source model by identifying a change in voltage as a function of time;
    determining a start time for the current in the current source model having the constant value;
    determining a time constant for the exponential decay value of the current in the current source model; and
    determining a transition time when the current begins the exponential decay value of the current in the current source model.

3. The method of claim 2, wherein the step of representing further comprises:
    replacing the drive logic element in the linear circuit representation of the first logic stage with a current source characterized as a function of the current at the constant value, the start time, the transition time, and the time constant.

4. The method of claim 1, wherein the first stage comprises the drive logic element, an input to the drive logic element, an interconnect, and the input of the next stage.

5. The method of claim 1, wherein the step of calculating further comprises representing the driven stage as a π circuit for use in calculating the value of the current source.

6. The method of claim 1, wherein the exponential decay is negative.

7. The method of claim 1, wherein the exponential decay is negative.

8. A computer readable medium configured to store instructions executable by a processor, the instructions to model a logic stage in a circuit for determining a delay between an input of a driving logic element gate and an input of a driven gate, the instructions when executed by the processor cause the processor to:
    identify, in a first logic stage, a drive logic element having an output;

identify, for each stage driven by the drive logic element in the first logic stage, a next stage logic element having an input configured to couple the output of the drive logic element;

identify interconnects between the output of the drive logic element and the input of each stage driven by the drive logic element;

represent the drive logic element as a current source model;

calculate a value for a current source in the current source model, the value comprising a constant value and an exponential decay value;

represent the first stage of the first logic stage with the current source model; and represent each next stage logic element as an equivalent resistor-capacitor circuit, the current source model and each equivalent resistor-capacitor circuit providing a linear circuit representation.

9. The computer readable medium of claim 8, wherein instructions that cause the processor to calculate further comprises instructions that cause the processor to:

determine a load capacitance value corresponding to the capacitance of the identified interconnects and a capacitance representative of each stage driven by the drive logic element;

determine the constant value for current in the current source model by identifying a change in voltage as a function of time;

determine a start time for the current in the current source model having the constant value;

determine a time constant for the exponential decay value of the current in the current source model; and determine a transition time when the current begins the exponential decay value of the current in the current source model.

10. The computer readable medium of claim 9, wherein the instructions that cause the processor to represent the first logic stage further comprises instructions that cause the processor to:

replace the drive logic element in the linear circuit representation of the first logic stage with a current source characterized as a function of the current at the constant value, the start time, the transition time, and the time constant.

11. The computer readable medium of claim 8, wherein the first stage comprises the drive logic element, an input to the drive logic element, an interconnect, and the input of the next stage.

12. The computer readable medium of claim 8, wherein the instructions that cause the processor to calculate further comprises instructions that cause the processor to represent the driven stage as a $\pi$ circuit for use in calculating the value of the current source.

13. A computer readable medium of claim 8, wherein the exponential decay is negative.

14. A computer readable medium of claim 8, wherein the exponential decay is negative.

* * * * *